United States Patent [19]

Taguchi

[11] Patent Number: 4,769,847
[45] Date of Patent: Sep. 6, 1988

[54] NOISE CANCELING APPARATUS

[75] Inventor: Tetsu Taguchi, Tokyo, Japan

[73] Assignee: NEC Corporation, Tokyo, Japan

[21] Appl. No.: 925,060

[22] Filed: Oct. 30, 1986

[30] Foreign Application Priority Data

Oct. 30, 1985 [JP] Japan .................................. 60-244517
Dec. 6, 1985 [JP] Japan .................................. 60-275443

[51] Int. Cl.$^4$ ........................................... H04B 15/00
[52] U.S. Cl. ..................................................... 381/94
[58] Field of Search ............................. 381/71, 94, 98;
379/406, 410, 411

[56] References Cited

U.S. PATENT DOCUMENTS 4,649,505 3/1987 Zinser, Jr. et al. .................... 381/94

Primary Examiner—Forester W. Isen
Attorney, Agent, or Firm—Sughrue, Mion, Zinn, Macpeak, and Seas

[57] ABSTRACT

In order to eliminate background noise infiltrating into an input audio signal, a noise-canceling apparatus includes: first and second acoustic pickups for primarily picking up the audio signal and noise, respectively; a filter receiving the output of the second acoustic pickup; a subtracter for subtracting the output of the filter, when the audio signal is silent, from the output of the first acoustic pickup; and a coefficient determination for determining coefficients of the filter so as to make the filter generate a noise signal corresponding to a signal generated by passing the noise through a transmission path having a transmission frequency characteristic from the noise source to the first acoustic pickup. The coefficients of the filter are determined on the basis of mutual-correlation coefficients between the outputs of the first and second pickups and self-correlation coefficients of the output of the second pickup, thereby improving the processing efficiency.

13 Claims, 2 Drawing Sheets

NOISE CANCELING APPARATUS

BACKGROUND OF THE INVENTION

This invention relates generally to a noise canceling apparatus, and more particularly to an improvement in the processing efficiency and the noise canceling performance of a noise canceling apparatus which removes background noise that infiltrates, from at least one noise source, into an acoustic pickup or transducer which generates audio (electric) input signals.

DESCRIPTION OF THE PRIOR ART

The audio output signals produced by an acoustic pickup or transducer disposed in an environment where noise sources exist contain the background noises that infiltrate into the pickup simultaneously. The most common system for canceling this noise estimates the frequency transmission characteristics, such as a transmission coefficient and impulse response of infiltration paths of the noise source, that is, the noise transmission paths from the noise source to the acoustic pickup and, then, outputs the noise of the noise source through the frequency transmission characteristics and subtracts the noise output from the output of the acoustic pickup.

The conventional noise canceling apparatus of the kind described above cancels the noise by first estimating the frequency transmission characteristics of the noise transmission paths, then outputting the output of an acoustic pickup disposed in such a manner as to pickup primarily the noise of a noise source through a filter, such as a transversal filter, as means for realizing the frequency transmission characteristics described above, and thereafter subtracting the output of the noise pickup from the output of an acoustic pickup for inputting audio signals. Generally, the estimation of such a transmission function is made by solving the inverse matrix having row and column numbers determined by the tap number of the constituent equivalent noise generation filter 13, a first solving method based upon the maximum inclination method, a second solving method utilizing adaptive control by any automatic control loop which minimizes the power of the noise-canceled residual waveform, and the like.

When the noise is to be canceled by the system described above, there would be no problem at all if only the noise to be canceled infiltrates into the acoustic pickup for picking up the noise. In practice, however, there are many operation backgrounds where audio signals infiltrate into the noise pickup together with the noise. In such a case, the noise containing the audio signals in mixture is outputted through the transversal filter, and this output is reduced from the output of the acoustic pickup for inputting the audio signals. Accordingly, the audio output signal obtained in this case is subject to output distortion or socalled "spatial modulation distortion" due to the frequency transmission characteristics of transmission paths other than the transmission path of the audio signals, such as a transmission path from the noise source to both acoustic pickup for the audio signals and for the noise.

SUMMARY OF THE INVENTION

It is, therefore, an object of the present invention to provide a noise canceling apparatus capable of improving the processing efficiency.

It is another object of the present invention to provide a noise canceling apparatus which fundamentally eliminates the occurrence of spatial modulation factor.

According to the present invention, there is provided a noise canceling apparatus comprising first and second acoustic pickups for primarily picking up the audio signals and noise, respectively, first filter means receiving the output of the second acoustic pickup, a subtracter for subtracting the output of the first filter means when the audio signal is silent from the output of the first acoustic pickup, and a coefficient determinator for determining coefficients of the first filter means so as to make the first filter means generate a noise signal corresponding to a signal generated by passing the noise through a transmission path having a transmission frequency characteristic from the noise source to the first acoustic pickup. The coefficients of the filter are determined on the basis of mutual correlation coefficients between the outputs of the first and second pickups and self-correlation coefficients of the output of the second pickup.

Other objects and features of the present invention will be clarified from the following description with reference to the drawings.

DETAILED DESCRIPTION OF THE PREFERRED EMBODIMENTS

Figure 1:
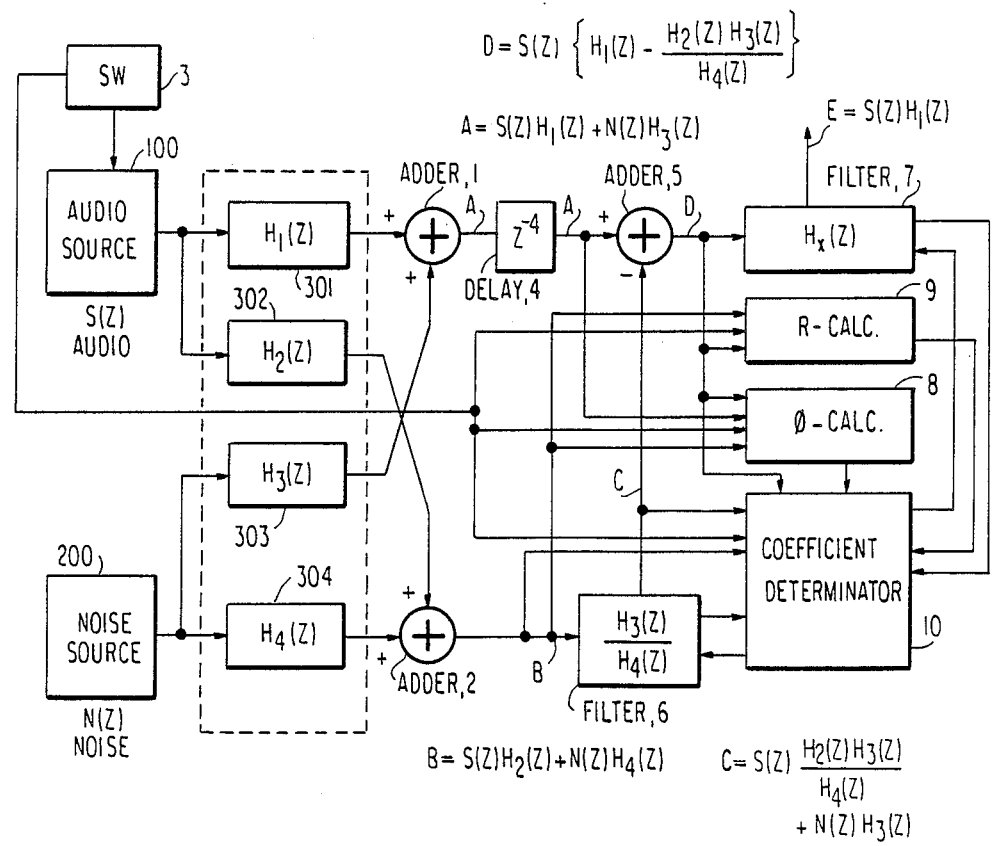
FIG. 1 is a block diagram showing one embodiment of the present invention.

FIG. 1 is a block diagram showing one embodiment of the present invention. This embodiment comprises adders 1 and 2, a communication switch 3, a delay circuit 4, an adder 5, transversal filters 6 and 7, a mutual correlation coefficient calculator 8, a selfcorrelation calculator 9 and a coefficient-determining unit 10. In addition, an audio source 100, a noise source 200 and transmission paths 301 to 304 are also shown in the drawing. The embodiment shown in FIG. 1 represents the case where there is only one noise source.

The audio signal S(Z) produced from the audio source 100 is supplied to the adder 1 through the transmission path 301 only when the mode is selected to be a communication mode by the communication switch 3.

The adder 1 represents a first audio pickup for receiving the audio signal S(Z). The noise N(Z) produced by the noise source 200 also infiltrates into the adder 1 through the transmission path 303. Assuming that the transmission paths 301 and 303 have frequency transmission characteristics defined by transmission functions $H_1(Z)$ and $H_3(Z)$, respectively, the output A of the adder is then given by the following formula:

$$A = S(Z)H_1(Z) + N(Z)H_3(Z) \tag{1}$$

The noise N(Z) produced by the noise source 200 is picked up by a second audio pickup for primarily picking up this noise, and the adder 2 represents this pickup. The noise N(Z) is inputted to the adder 2 through the transmission function $H_4(Z)$ of the transmission path 304. The audio signal S(Z) infiltrates, too, into this adder 2 through the transmission path 302 of $H_2(Z)$. Accordingly, the output B of adder 2 is represented by the following equation:

$$B = S(Z)H_2(Z) + N(Z)H_4(Z) \qquad (2)$$

In general, so-called noise-canceling processing is directed to eliminating the influence of component $N(Z)H_3(Z)$, due to the noise source 200, from A of formula (1), by some means. Ordinarily, such means outputs the noise $N(Z)$ intentionally picked up through the frequency transmission characteristics of the mixed transmission path in order to generate the noise which is substantially equivalent to the noise infiltrating into the acoustic pickup for inputting the audio signal, and then subtracts this output from the output of the acoustic pickup for inputting the audio signal so as to cancel the noise. In this case, the frequency transmission characteristics of the transmission path are realized by a transversal filter, and its transmission function and impulse response are generally employed for processing.

Figure 2:
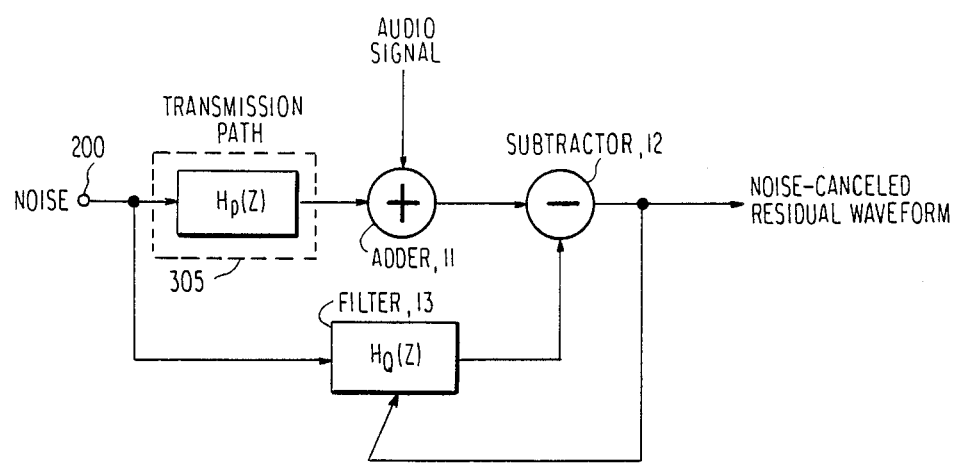
FIG. 2 is a schematic diagram useful for explaining the fundamental method of estimating the transmission function of a noise transmission path.

FIG. 2 is an explanatory view for estimating the transmission function, and is useful for explaining the fundamental method of estimating the transmission function of the noise transmission path.

The audio signal is inputted to an adder 11 representing the first acoustic pickup, and the noise infiltrates into, and adds to superposedly, the audio signal from the noise source 200 through the transmission path 305. The output of the adder 11 is supplied to a subtracter 12. On the other hand, an equivalent noise generation filter 13, in the form of a transversal filter, outputs the noise which is intentionally picked up by the second acoustic pickup, and this output is applied to the subtracter 12 and subtracted from the output of the adder 11. In this case, if the filter coefficient of the equivalent noise generation filter 13 is set so that the power of the noise-canceled residual waveform outputted by the subtracter 12 becomes minimal, its transmission function $H_Q(Z)$ is substantially equivalent to $H_P(Z)$. In other words, $H_Q(Z)$ obtained in this manner is the estimated transmission function of the noise transmission path 305, and the gist of the noise cancellation resides in obtaining this estimated transmission function. As stated before, the estimation of such a transmission function is made by solving the inverse matrix having row and column numbers determined by the tap number of the constituent equivalent noise generation filter 13, the maximum inclination method, and adaptive method control method by any automatic control loop. The following method improves the processing efficiency of the fundamental processing systems described above.

Figure 3:
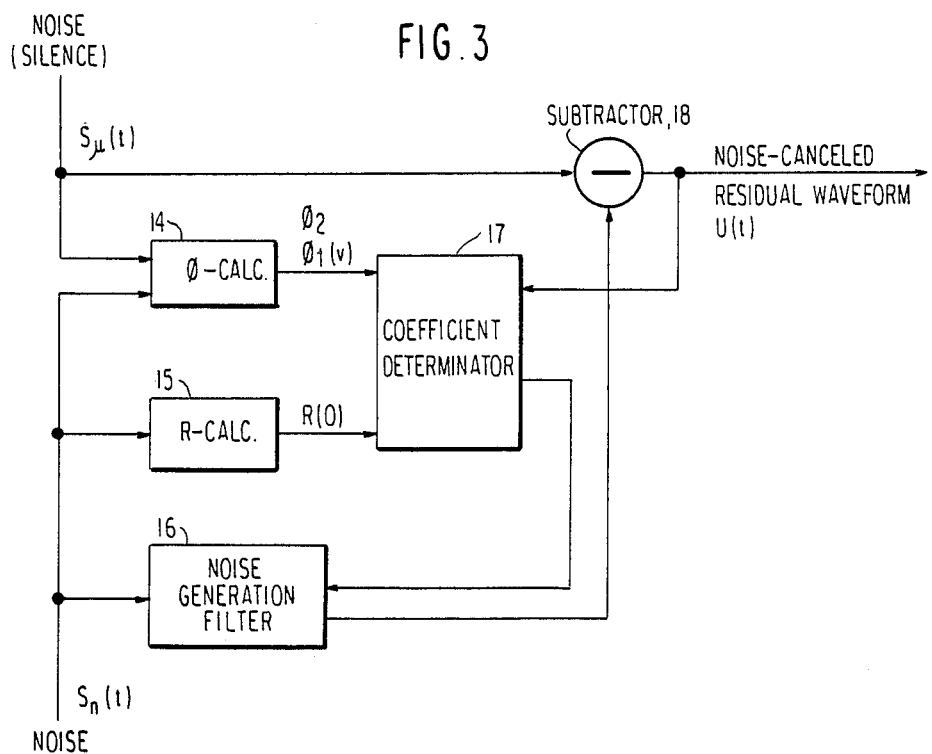
FIG. 3 is a schematic diagram useful for explaining the method of estimating the efficient transmission function of the noise transmission path.

FIG. 3 is a diagram showing the fundamental processing for efficiently estimating the transmission function of the noise transmission path.

When the audio signal is silent, the output of the first acoustic pickup, that is, the noise at the time of silence, is supplied as $S_\mu(t)$ to a mutual correlation function calculator 14 and to a subtracter 18. On the other hand, the noise of the noise source picked up intentionally by the second acoustic pickup, that is $S_n(t)$, is supplied to the mutual correlation function calculator 14, a self-correlation function calculator 15 and to an equivalent noise generation filter 16. In this case, since the noise at the time of silence, i.e., $S_\mu(t)$, can be regarded as linear coupled with the noise of the noise source, i.e., $S_n(t)$, noise canceling by mutual offset between these two noises is possible.

Here, it will be presumed that the filter coefficient of the equivalent noise generation filter 16, in the form of a transversal filter, is set at a tap position that is delayed by $\tau$, and other coefficients are all zero. In this case, the noise-canceled residual waveform $U(t)$ generated by the subtracter 18 is given by the following formula (3):

$$U(t) = S_\mu(t) - aS_n(t - \tau) \qquad (3)$$

If the number of observation sections is N and the electric power $U(t)$ of the formula (3) is E, then E is given by the following formula (4):

$$E = \sum_{n=1}^{N} U^2(t)\{s_\mu{}^i(t) - 2aS_\mu(t) \cdot S_n(t - \tau) + a^2 S_n{}^2(t - \tau)\} \qquad (4)$$

The coefficient a that minimizes E is obtained as a that makes zero the following formula (5):

$$a = \frac{\sum_{t=1}^{N} S_\mu(t) \cdot S_n(t - \tau)}{\sum_{t=1}^{N} S_n{}^2(t - \tau)} \qquad (5)$$

A numerator on the right side of the formula (5) represents a mutual correlation coefficient $\phi(\tau)$ of $S_\mu$ and $S_n$ at the tap $\tau$, and the denominator denotes a self-correlation coefficient $R(O)$ of $S_n$ at the tap zero. Using these symbols, the formula (5) can be expressed as the following formula, $$a = \phi(\tau)/R(O) \qquad (6)$$

If the coefficient a is determined, $U(t)$ is determined from the formula (3). The $U(t)$ thus obtained is regarded to be $S_n(t)$, and one filter coefficient which minimizes the power of the noise-canceled residual waveform is estimated. The above operation is repeated until the noise-canceled residual waveform becomes smaller than a predetermined level.

If a mutual correlation coefficient between $U(t)$ and $S_n(t)$ is denoted by $\phi_1(v)$, then $\phi_1(v)$ is given by the following formula (7):

$$\begin{aligned}
\phi_1(v) &= \sum_{t=1}^{N} U(t) S_n(t + v) \\
&= \sum_{t=1}^{N} \{S_u(t) - aS_n(t - \tau) S_n\}(t + v) \\
&= \sum_{t=1}^{N} S_\mu(t) S_n(t + v) - \\
&\quad \sum_{t=1}^{N} aS_n(t - \tau) S_n(t + v) \\
&= \phi(v) - aR(\tau + v)
\end{aligned} \qquad (7)$$

The formula (7) means that once the mutual correlation coefficient $\phi(v)$ is determined at the tap v, $\phi_1(v)$ for each of the maximum values can be determined by correcting $\phi(v)$ by $aR(\tau-v)$. The filter coefficient that minimizes the power of the noise-canceled residual waveform can be obtained by dividing the resulting $\phi_1(v)$ value by $R(O)$ and normalizing it. In this manner, the mutual correlation coefficient between $U(t)$ and $S_n(t)$ is determined. After $\phi(\tau)$ at its maximum value is retrieved, it is divided by the self-correlation function $R(O)$ to determine a, and then the $\phi_1(v)$ value, obtained by determining the mutual correlation coefficient of $U(t)$ and $S_n(t)$ in accordance with the formula (7), is divided by a and normalized. The filter coefficient can be determined efficiently by repeating these procedures. In FIG. 3, a coefficient determinator 17 receives the coefficients data from the mutual correlation coefficient calculator 14 and the self-correlation function calculator 15, determines efficiently the filter coefficient by utilizing the $U(t)$ data, too, provides it to the equivalent noise generation filter 16 and completes the estimation of the efficient transmission function of the noise transmission path.

Turning back again to the embodiemnt shown in FIG. 1, the explanation of the embodiment will be continued.

The embodiment shown in FIG. 1, too, utilizes fundamentally the estimation means of the efficient transmission function shown in FIG. 3, and its detailed operation is as follows.

The output A of the adder 1 is applied to the delay circuit 4. The delay circuit 4 corrects the phase deviation between the inputs which is caused by the relative positions of the first acoustic pickup represented by the adder 1 and the second acoustic pickup represented by the adder 2, and the delay quantity corresponding to the phase differnece to be corrected is added to the output A of the adder 1 by cascade delay elements of an L stage and is then applied to the adder 5 and the mutual correlation coefficient calculator 8.

On the other hand, the output B of the adder 2 representing the second acoustic pickup is applied to the transversal filter 6, the mutual correlation coefficient calculator 8, the self-correlation coefficient calculator 9 and the coefficient determinator 10.

The coefficient of the transversal filter 6 is set so as to have a transmission function of an $H_3/H_4$ value. This is the filter which subtracts the output C, outputted through this filter, from the output of the delay circuit 4 in order to eliminate the noise $N(Z)$ contained in the output A due to the noise source 200. The output C obtained by this filter is given by the following formula (8):

$$C = S(Z) \frac{H_7(Z) H_3(Z)}{H_4(Z)} + N(Z) H_3(Z) \qquad (8)$$

In other words, the function of the transversal filter 6 is to generate the noise component $N(Z)H_3(Z)$ contained in the output A. In this embodiment, this transversal filter provides a transmission function having the value $H_3/H_4$ to the output B of the adder 2. Here, since both $H_3$ and $H_4$ are unknown values, the transmission function $H_3/H_4$ must be estimated by some means. This embodiment estimates the transmission function in the following manner in accordance with the conventional method explained with reference to FIG. 3.

The output B of the adder 2 and the output A of the delay circuit 4 are applied to the mutual correlation coefficient calculator 8 while the output B of the adder 2 is applied to the self-correlation coefficient calculator 9. They calculate the mutual correlation coefficient series and self-correlation coefficient series under the silent state and supply them to the coefficient determinator 10. The silent state is set by a silence signal of a silence representing signal of a type specified in advance, that is generated when the communication switch 3 is in the non-communication mode and is a binary code "1" level in this embodiment. The output B in the silent state is $N(Z)H_4(Z)$ and the output A is $N(Z)H_3(Z)$. The transversal filter 6 provides the transmission function $H_3(Z)/H_4(Z)$ converting the output B at the time of silence to the output A at the time of silence.

Setting of such a transmission function in accordance with the conventional estimation method results in the estimation processing which determines the filter coefficient of the transversal filter 6 necessary to minimize the noise-canceled residual waveform obtained by subtracting the output of the transversal filter 6 from the output A at the time of silence, and this can be made by the calculation of the formulae (3) to (7) by the coefficient determinator 10 by utilzing the mutual correlation coefficient output between the outputs A and B by the mutual correlation coefficient calculator 8 and the self-correlation coefficient output of the output B by the self-correlation coefficient calculator 8. The coefficient determinator 10 receives the output of the adder 5 and the output of the transversal filter 6 and cyclically calculates the formulae (3) to (7) until the noise-canceled residual waveform obtained as the difference of these outputs is below a predetermined level, and thus determines the filter coefficient of the transversal filter 6. The transversal filter 6 outputs the output B at the time of silence through the transmission function $H_3/H_4$ determined in this manner to obtain the output C represented by the formula (8), and this output C is added by the adder 5 after its code is inverted. While $N(Z)H_3(Z)$ is canceled as the common item, the output D of the formula (9) below can be obtained:

$$D = S(Z) H_1(Z) + N(Z) H_3(Z) - \qquad (9)$$
$$\left\{ S(Z) \frac{H_2(Z) H_3(Z)}{H_4(Z)} + N(Z) H_3(Z) \right\}$$
$$= S(Z) \left\{ H_1(Z) - \frac{H_2(Z) H_3(Z)}{H_4(Z)} \right\}$$

The component relating to the noise $N(Z)$ is removed from the output of the formula (9). In other words, though the mixture of the noise $N(Z)$ is removed, the transmission function for $S(Z)$ is associated with the second item in the bracket, that is $H_2(Z) \cdot H_3(Z)/H_4(Z)$, besides $H_1(Z)$ due to the transmission path 301. This second item component is the effective change of the transmission function $H_1(Z)$ based on the mixture of the audio signal $S(Z)$ in addition to the noise $N(Z)$ for the adder 2, and is a so-called "spatial modulation element". This function is a distoration which adversely affects and causes deterioration of the sound quality.

Let's consider a transversal filter 7 having a transmission function $H_x(Z)$ for the output $E=S(Z)H_1(Z)$ obtained by removing the spatial modulation element component from the output D represented by the formula (9). It is obvious that such a transversal filter can be constituted fundamentally, and moreover the processing can be made in the following manner in the same way as the processing explained with reference to FIG. 3.

When the input and output of the adder 5 are compared with each other, they exhibit a strong correlation for the audio signal but not naturally for the noise. From this aspect, the construction of the transversal filter having the transmission function $H_x(Z)$ obtained the output E from the output D results in the synthesis of only the portion relating to $S(Z)$ of the output A as linear coupling of the waveform of the output D. This can be accomplished readily by retrieving the maximum value of the mutual correlation coefficient between the outputs D and A, then normalizing it by the self-correlation function of the output D to determine the first filter coefficient, and thereafter executing cyclically the filter coefficient which minimizes the power of the noise-canceled residual waveform to sequentially estimate the filter coefficients in accordance with formulae (3) to (7).

The mutual correlation coefficient calculator 8 receives the outputs A and D to calculate the mutual correlation coefficient while the self-correlation coefficient calculator 9 calculates the self-correlation coefficient of the output D. These coefficients are supplied to the coefficient determinator 10.

Upon receiving these mutual and self-correlation coefficients, the coefficient determinator 10 minimizes the power of the noise-canceled residual waveform as the difference between the output of the transversal filter 7 and the output D, determines cyclically the filter coefficients in accordance with the formulae (3) to (7), repeats these operations until the power is below the predetemined level and estimates $H_x(Z)$. The output D obtained through $H_x(Z)$ estimated in this manner substantially provides only $S(Z)H_1(Z)$, and the spatial modulation distortion can be removed substantially.

The description given above is based upon the premise that the audio signal S(Z) and the noise N(Z) do not have any correlation, but this condition can be expected easily under normal operating conditions.

Although the embodiment shown in FIG. 1 illustrates the case where there is only one noise source by way of example, noise cancelation can obviously be easily made by expanding and utilizing the same processing procedure even when a plurality of noise sources exist.

The embodiment shown in FIG. 1 utilizes the estimation of the transversal filter coefficient by utilization of the mutual- and self-correlation coefficients on the basis of the formulae (3) to (7) in order to remove the noise infiltrating into the audio signal and the spatial modulation distortion. However, it is, of course, possible to accomplish these objects by use of other filter coefficient estimation means such as solution means for solving the inverse matrix having row and column numbers or adaptive retrieval utilizing the maximum inclination method described already, or the like. Modified embodiments of the embodiment described above can be made readily without departing from the spirit and scope of the present invention.

What is claimed is:

1. A noise canceling apparatus comprising:
   a first acoustic pickup for primarily picking up an audio signal and a first noise signal which is transferred from a noise source thereto through a transmission path having a transmission frequency characteristic;
   at least one second acoustic pickup for primarily picking up a second noise signal generated by said noise source;
   a filter means receiving the output of said second acoustic pickup;
   subtracter means having two inputs for subtracting the output of said filter means from the output of said first acoustic pickup when said audio signal is silent;
   first calculator means for calculating mutual-correlation coefficients between the outputs of said first and second pickups;
   second calculator means for calculating self-correlation coefficients of the output of said second pickup; and
   coefficient determinator means for determining the coefficients of said filter means on the basis of the calculated mutual-correlation coefficients and self-correlation coefficients so as to make said filter means generate a noise signal corresponding to said first noise signal.

2. A noise canceling apparatus as defined in claim 1, further comprising delay means for compensating phase difference between the two inputs to said subtracter means.

3. A noise canceling apparatus as defined in claim 1, wherein said filter means is a transversal filter.

4. A noise canceling apparatus comprising:
   a first acoustic pickup for primarily picking up an audio signal;
   at least one second acoustic pickup for primarily picking up a noise signal;
   a filter means receiving the output of said second acoustic pickup;
   subtracter means for subtracting the output of said filter means from the output of said first acoustic pickup when said audio signal is silent;
   first calculator means for calculating mutual-correlation coefficients between the outputs of said first and second pickups;
   second calculator means for calculating self-correlation coefficients of the output of said second pickup;
   first determinator means for normalizing the maximum value of the calculated mutual-correlation coefficients with the calculated self-correlation coefficients and determining a normalized coefficient as a filter coefficient for said filter means corresponding to a time delay of the maximum mutual-correlation coefficient;
   third calculator means for calculating mutual-correlation coefficients between the outputs of said first acoustic pickup and said filter means with the filter coefficient having been determined so far; and
   second determinator means for normalizing the maximum value of those mutual-correlation coefficients which are calculated by said third calculator means with the self-correlation coefficients and determining a normalized coefficient as another filter coefficient for said filter means corresponding to a time delay of the maximum value of those mutual-correlation coefficients which are calculated by said third calculator means until the output of said subtracter means becomes less than a predetermined value.

5. A noise canceling apparatus comprising:
   a first acoustic pickup for primarily picking up an audio signal;
   at least one second acoustic pickup for primarily picking up a noise signal;
   a filter means receiving the output of said second acoustic pickup;
   subtracter means having two inputs for subtracting the output of said filter means from the output of said first acoustic pickup when said audio signal is silent;

first calculator means for calculating mutual-correlation coefficients between the outputs of said first and second pickups;

second calculator means for calculating self-correlation coefficients of the output of said second pickup;

first determinator means for normalizing the maximum value of the calculated mutual-correlation coefficients with the calculated self-correlation coefficients and determining a normalized coefficient as a first filter coefficient for said filter means corresponding to a time delay of the maximum mutual-correlation coefficients;

third calculator means for calculating corrected mutual-correlation coefficients by correcting the mutual-correlation coefficients having been determined so far on the basis of said self-correlation coefficients; and second determinator means for normalizing the maximum value of the corrected mutual-correlation coefficients with said self-correlation coefficients and determining a normalized coefficient as another filter coefficient for said filter means corresponding to a time delay of the maximum value of said corrected mutual-correlation coefficients until the output of said subtracter means becomes below a predetermined value.

6. A noise canceling apparatus as defined in claim 5, further comprising delay means for compensating phase difference between the two inputs to said subtractor means.

7. A noise canceling apparatus as defined in claim 5, wherein said filter means is a transversal filter.

8. A noise canceling apparatus comprising:
a first acoustic pickup for primarily picking up an audio signal;
at least one second acoustic pickup for primarily picking up a noise signal;
a first filter means receiving the output of said second acoustic pickup and having a transmission frequency characteristic H3/H4, H3 and H4 representing transmission frequency characteristics from a noise source to said first and second acoustic pickup, respectively;
a first subtractor means for subtracting the output of said first filter means from the output of said first pickup; and
a first calculator means for calculating first mutual-correlation coefficients between the outputs of said first and second pickups;
a second calculator means for calculating self-correlation coefficients of said second pickup output;
a first coefficient determinator means for determining first filter coefficients for said first filter means on the basis of said first mutualcorrelation coefficients and said self-correlation coefficients;
a second filter means receiving the output of said subtractor means; and
a second coefficient determinator means for determining second filter coefficients for said second filter means so as to minimize the difference between the input and the output of said second filter means.

9. A noise canceling apparatus as defined in claim 8, wherein said first coefficient determinator means includes first normalizing means for normalizing the maximum value of said first mutual-correlation coefficients with the self-correlation coefficients and generating the normalized coefficient as a first one of said first filter coefficients corresponding to a time delay of the maximum value of said first mutual-correlation coefficients, a third calculator means for calculating second mutual-correlation coefficients between the outputs of said first acoustic pickup and said first filter means with the first filter coefficient which has been determined so far, and a second normalizing means for normalizing the maximum value of said second mutual-correlation coefficients calculated by said third calculator means with the self-correlation coefficients and determining a normalized coefficient as another of said first filter coefficients corresponding to a time delay of the maximum value of said second mutual-correlation coefficients until the output of said subtractor means becomes less than a predetermined value.

10. A noise canceling apparatus as defined in claim 8, wherein said second coefficient determinator means includes;
third calculator means for calculating third mutual-correlation coefficients between the input and the output of said first subtracter means;
fourth calculator means for calculating self-correlation coefficients of the output of said first substracter means; and
fifth calculator means for calculating the coefficients of said second filter means on the basis of said third mutual-correlation coefficients and the self-correlation coefficients calculated by said fourth calculator means.

11. A noise canceling apparatus as defined in claim 8, further comprising delay means for compensating phase difference between the two inputs to said first subtractor means.

12. A noise canceling apparatus as defined in claim 8, wherein said first filter means is a transversal filter.

13. A noise canceling apparatus as defined in claim 8, wherein said first and second filter means are transversal filters.

* * * * *

UNITED STATES PATENT AND TRADEMARK OFFICE
CERTIFICATE OF CORRECTION

PATENT NO. : 4,769,847
DATED : September 6, 1988
INVENTOR(S) : Tetsu Taguchi

It is certified that error appears in the above-identified patent and that said Letters Patent is hereby corrected as shown below:

Column 4, line 15, Delete "$U^2(t)\{s_L{}^t(t)$", and insert --$U^2(t)\{s_L{}^2(t)$--.

Column 5, line 12, delete "embodiemnt", and insert --embodiment--.

Column 5, line 25, delete "differnece", and insert --difference--.

Column 5, line 43, delete "$\dfrac{H_7(Z)H_3(Z)}{H_4(Z)}$" and insert -- $\dfrac{H_2(Z)H_3(Z)}{H_4(Z)}$ --

Column 6, line 33, after d insert -- - --.

Column 6 --distorti

Signed and Sealed this

Thirtieth Day of April, 1991

*Attest:*

HARRY F. MANBECK, JR.

*Attesting Officer*    *Commissioner of Patents and Trademarks*